United States Patent
Kwon et al.

(10) Patent No.: US 8,981,494 B2
(45) Date of Patent: Mar. 17, 2015

(54) ECO LOGIC CELL AND DESIGN CHANGE METHOD USING ECO LOGIC CELL

(75) Inventors: Seok Il Kwon, Seoul (KR); Hoijin Lee, Seoul (KR); Hyejoo Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 16 days.

(21) Appl. No.: 13/615,034

(22) Filed: Sep. 13, 2012

(65) Prior Publication Data

US 2013/0069169 A1    Mar. 21, 2013

(30) Foreign Application Priority Data

Sep. 20, 2011 (KR) .................. 10-2011-0094709

(51) Int. Cl.
  *G06F 17/50* (2006.01)
  *H01L 27/02* (2006.01)
  *H01L 27/088* (2006.01)
  *H01L 27/118* (2006.01)

(52) U.S. Cl.
  CPC .......... *G06F 17/505* (2013.01); *H01L 27/0207* (2013.01); *H01L 27/088* (2013.01); *H01L 27/11807* (2013.01)
  USPC .......................................... 257/401; 257/402

(58) Field of Classification Search
  CPC ................ H01L 27/0207; H01L 29/66795; H01L 27/11898
  USPC .................................................. 257/401, 202
  See application file for complete search history.

(56) References Cited

U.S. PATENT DOCUMENTS

| | | | |
|---|---|---|---|
| 6,581,199 B2 | 6/2003 | Tanaka | |
| 6,974,978 B1 * | 12/2005 | Possley | ......................... 257/204 |
| 7,919,793 B2 | 4/2011 | Iwata | |
| 7,919,981 B2 | 4/2011 | Irie | |

FOREIGN PATENT DOCUMENTS

| | | |
|---|---|---|
| JP | 2002-259477 | 9/2002 |
| JP | 2009-038072 | 2/2009 |
| JP | 2010-171243 | 8/2010 |

* cited by examiner

*Primary Examiner* — Tran Tran
(74) *Attorney, Agent, or Firm* — Onello & Mello, LLP

(57) ABSTRACT

The function of logic cells may be changed by altering their metal routing. Logic cells altered in this manner may be used to correct, substitute, or otherwise alter the operation of logic blocks or scan paths without completely re-working an integrated circuit. The process may be referred to as an engineering change order (ECO) process. According to an exemplary process a buffer may be reconfigured to operate as a NAND gate, a NOR gate, or an INVERTER, for example, and may be configured to operate in a circuit in need of such a logic function.

7 Claims, 20 Drawing Sheets

Buffer Cell

NAND Cell

NOR Cell

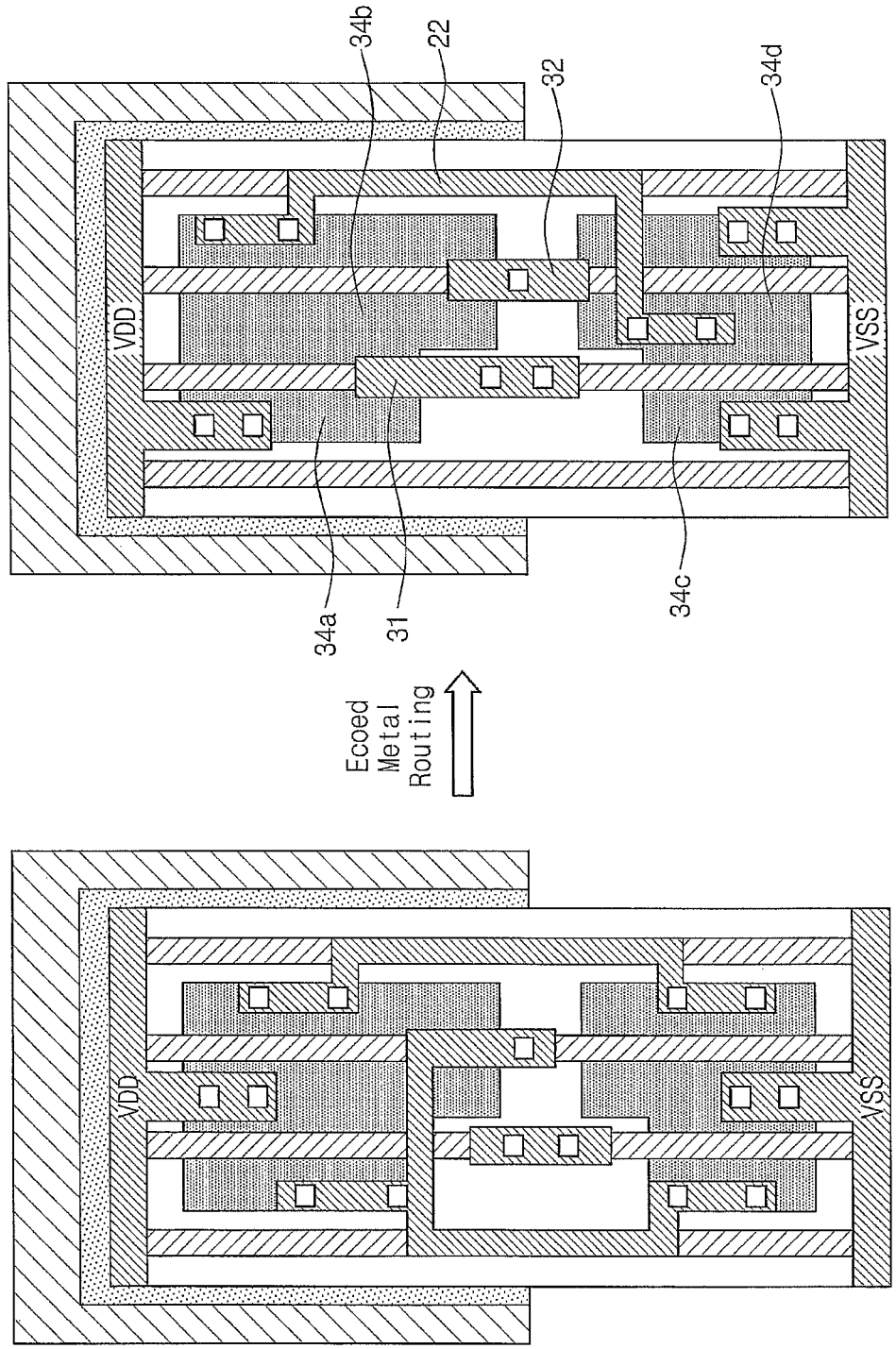

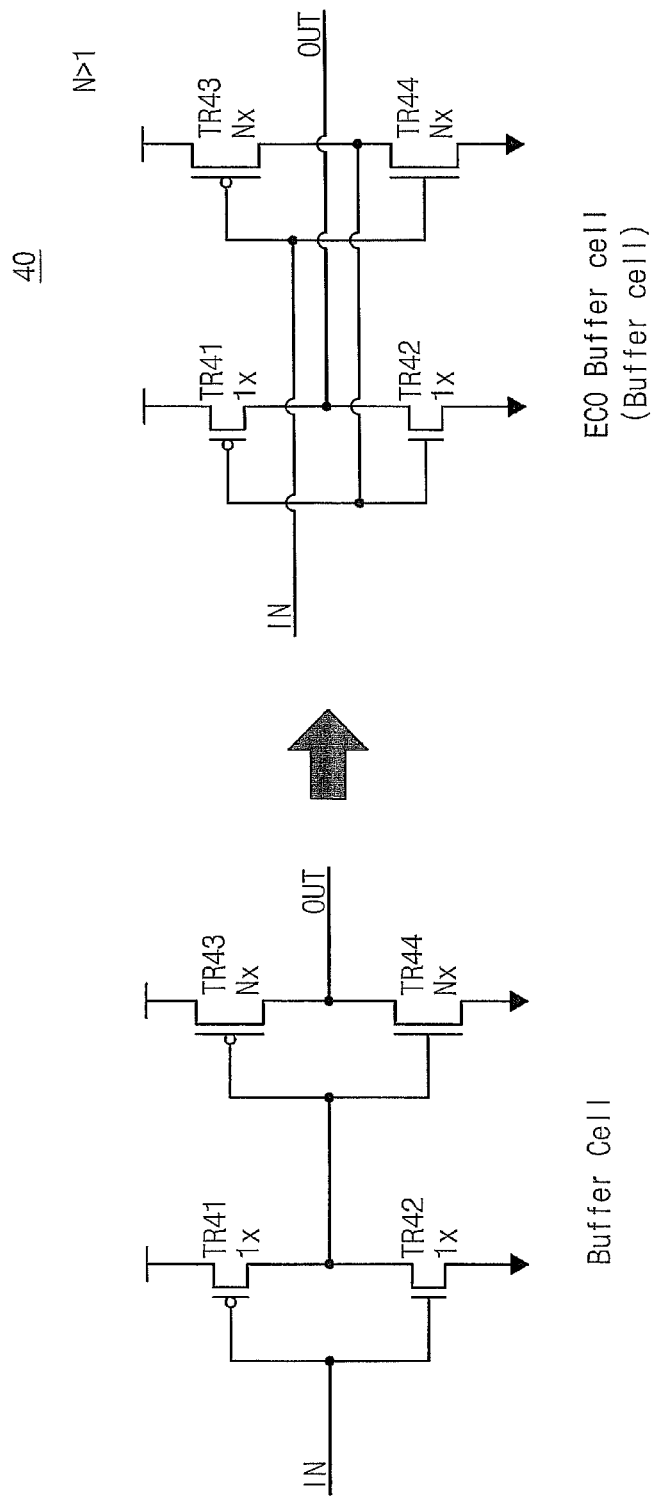

ECO LOGIC CELL AND DESIGN CHANGE METHOD USING ECO LOGIC CELL

CROSS-REFERENCE TO RELATED APPLICATIONS

This application claims the benefits, under 35 U.S.C §119, of Korean Patent Application No. 10-2011-0094709 filed Sep. 20, 2011, the entirety of which is incorporated by reference herein.

BACKGROUND

Exemplary embodiments in accordance with principles of inventive concepts relate to an engineering change order (ECO) logic cell that may be readily adapted and a method using such an ECO logic cell.

An integrated circuit (IC) may include logic gate and circuit modules formed on a semiconductor substrate by stacking a plurality of metal layers. The IC may include logic gates in large numbers to perform complicated operations. During a manufacturing process, such as, at product inspection or testing, it may be determined that design changes, or rerouting of circuits, such as logic gates, in the IC may be desirable. Such modifications may be referred to as engineering change order (ECO) modifications, or adaptations, for example.

An ECO may require the addition of new logic gates to an existing circuit design. Such an adaptation could significantly alter a circuit design and may increase cost to produce a product associated with a circuit being modified.

SUMMARY

In an exemplary embodiment in accordance with principles of inventive concepts an engineering change order (ECO) logic cell may be formed by changing a metal layer of a logic cell, such as a buffer cell. The ECO logic cell may include an input node configured to receive an input signal; an output node configured to provide an output signal according to the function of the logic cell; an active layer substantially the same as an active layer of a buffer cell within the integrated circuit; a polysilicon layer substantially the same as a polysilicon layer of a buffer cell within the integrated circuit; and a metal layer connecting the polysilicon layer to the input node or the output node, wherein the ECO logic cell performs a logic operation different from, and delay longer than, the buffer cell from which it was formed. The active region includes drain and source regions of a transistor and the polysilicon layer may include a gate region of the transistor.

In accordance with principles of inventive concepts, the active layer of the ECO logic cell may be narrower than an active layer of a non-ECO NAND cell or a non-ECO NOR cell and the active layer of the ECO logic cell is wider in area than an active layer of a non-ECO inverter cell.

In an exemplary embodiment in accordance with principles of inventive concepts, the input node may be connected to a transistor having a relatively weak drive capacity from among a plurality of transistors included in the ECO logic cell.

In an exemplary embodiment in accordance with principles of inventive concepts, this embodiment, the output node may be connected to a transistor having a relatively strong drive capacity, from among a plurality of transistors included in the ECO logic cell.

In exemplary embodiments in accordance with principles of inventive concepts, a method for implementing an Engineering Change Order (ECO) for an integrated circuit includes separating a first logic cell from a peripheral block; converting the first logic cell into an ECO logic cell by revising a metal routing between transistors within in the first logic cell; and connecting the ECO logic cell to a logic block requiring ECO modification.

In an exemplary embodiment in accordance with principles of inventive concepts, the peripheral block may be a scan path block or a second logic block and the first logic cell may be a buffer cell.

In accordance with principles of inventive concepts, the logical operation of the cell from which the altered cell is derived may have a different logical function than that of the altered cell. For example, the unaltered logic cell may be a buffer cell and the altered, or ECO, cell may be a NAND, NOR, or INVERTER cell.

In an exemplary embodiment in accordance with principles of inventive concepts, the interconnection between a cell that has been altered by altering its metallization may be altered by altering the metallization between cells.

In an exemplary embodiment in accordance with principles of inventive concepts, a second ECO logic cell and logic cell may be buffer cells and the second ECO logic cell may have a cell delay time longer than that of the second logic cell.

In an exemplary embodiment in accordance with principles of inventive concepts the metallization of a logic cell may be altered to yield a logic cell that may, after altering the metallization, be used to repair or otherwise address requirements for other logic cells in an integrated circuit. In an exemplary embodiment, such alteration may be carried in response to results of a test conducted on the integrated circuit.

In an exemplary embodiment in accordance with principles of inventive concepts, the metallization of a buffer cell may be altered to yield a NAND logic cell.

In an exemplary embodiment in accordance with principles of inventive concepts, the metallization of a buffer cell may be altered to yield a NOR logic cell.

In an exemplary embodiment in accordance with principles of inventive concepts, the metallization of a buffer cell may be altered to yield an INVERTER logic cell.

In an exemplary embodiment in accordance with principles of inventive concepts, the metallization of a buffer cell may be altered to yield a buffer logic cell having different electrical characteristics than the original buffer cell.

BRIEF DESCRIPTION OF THE FIGURES

The above and other objects and features will become apparent from the following description with reference to the following figures, wherein like reference numerals refer to like parts throughout the various figures unless otherwise specified, and wherein

FIG. 7B is a diagram schematically illustrating a layout of an ECO NOR cell illustrated in FIG. 7A.

FIG. 9A is a circuit diagram schematically illustrating an exemplary embodiment of an ECO buffer cell in accordance with principles of inventive concepts.

DETAILED DESCRIPTION

Figure 1:
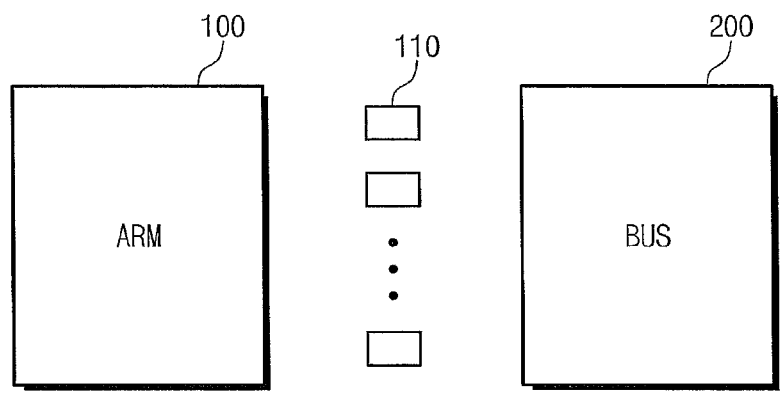
FIG. 1 is a diagram for describing a design changing method using a spare cell.

Exemplary embodiments in accordance with principles of inventive concepts will now be described more fully with reference to the accompanying drawings, in which exemplary embodiments are shown. Exemplary embodiments in accordance with principles of inventive concepts may, however, be embodied in many different forms and should not be construed as being limited to the embodiments set forth herein; rather, these embodiments are provided so that this disclosure will be thorough and complete, and will fully convey the concept of exemplary embodiments to those of ordinary skill in the art. In the drawings, the thicknesses of layers and regions may be exaggerated for clarity. Like reference numerals in the drawings denote like elements, and thus their description may not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments in accordance with principles of inventive concepts are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments in accordance with principles of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments in accordance with principles of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, semiconductor devices and methods of fabricating the same according to exemplary embodiments in accordance with principles of inventive concepts will now be described more fully with reference to the accompanying drawings.

Combinatorial or timing errors may be detected in an integrated circuit during a manufacturers test, for example. In an exemplary embodiment in accordance with principles of inventive concepts an integrated circuit may include engineering change order (ECO) circuitry that may be configured to correct for such errors. In particular, in exemplary embodiments in accordance with principles of inventive concepts, ECO logic cells may be included in an integrated circuit without substantially adding to the structure or complexity of an integrated circuit.

The block diagram of FIG. 1 depicts an exemplary embodiment of an integrated circuit in accordance with principles of the concepts that may include a processor, such as an advanced reduced instruction set machine (ARM), ARM 100, a bus circuit BUS 200, and a repair cell 110, for example. ARM 100 and the BUS 200 circuits are merely exemplary, and are included to illustrate the way in which spare cell 110 may operate along with other circuit components.

Spare cell 110 may be included in an integrated circuit to permit circuit changes at a time, during final manufacturing tests, for example, when a circuit design is substantially complete and design changes would otherwise be time-consuming and costly. In exemplary embodiments in accordance with principles of inventive concepts, spare cell 110 may be embodied as any of a variety of logic cells. For example, spare cell 110 may be a buffer cell, a NAND cell, a NOR cell, an AND cell, an OR cell, and the like. Exemplary embodiments of such cells in accordance with principles of inventive concepts will be described in greater detail in the discussion related to figures below. As illustrated in FIG. 1, spare cell 110 may be included at an otherwise surplus or empty space of an integrated circuit. Such a space in which spare cell 110 is inserted may be an isolation space between blocks. For example, spare cell 110 may be located in an isolation space between ARM 100 and BUS 200.

During a circuit-modification procedure, which may be referred to herein as an engineering change order (ECO) procedure, one or more logic blocks may be reconfigured or rerouted using metal routing and spare cell 110. As will be described in greater detail below, such a process in accordance with principles of inventive concepts may employ redundant logic cells, such as spare cell 110, or may be accomplished by re-purposing logic cells that are operationally integrated in a circuit. In accordance with principles of inventive concepts, a logic cell may be modified, in a process referred to herein as an ECO process, by altering the metal routing of the cell itself, in order to supply logic cells needed to correct integrated circuit flaws.

Figure 2:
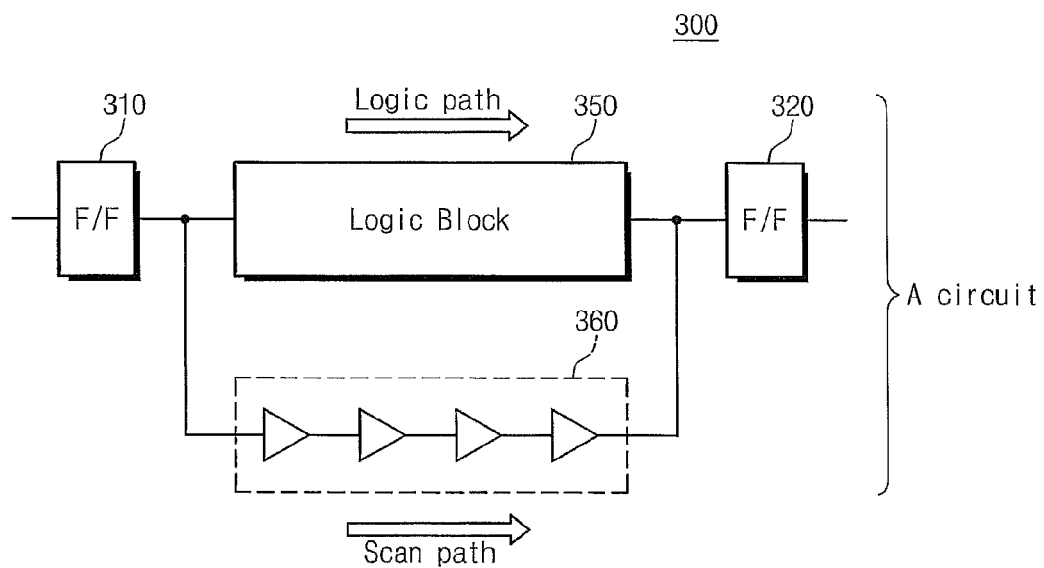
FIG. 2 is a diagram schematically illustrating an integrated circuit including a plurality of logic blocks and a scan path block.
Figure 2:
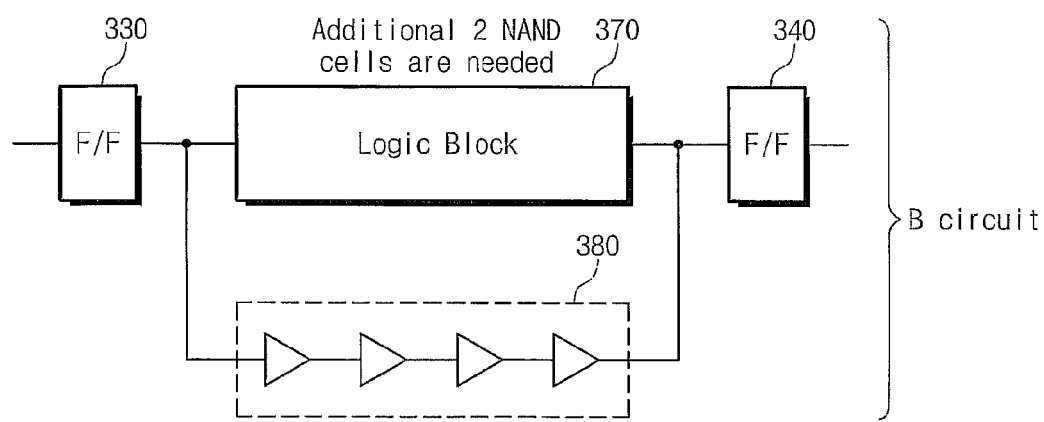
Figure 3:
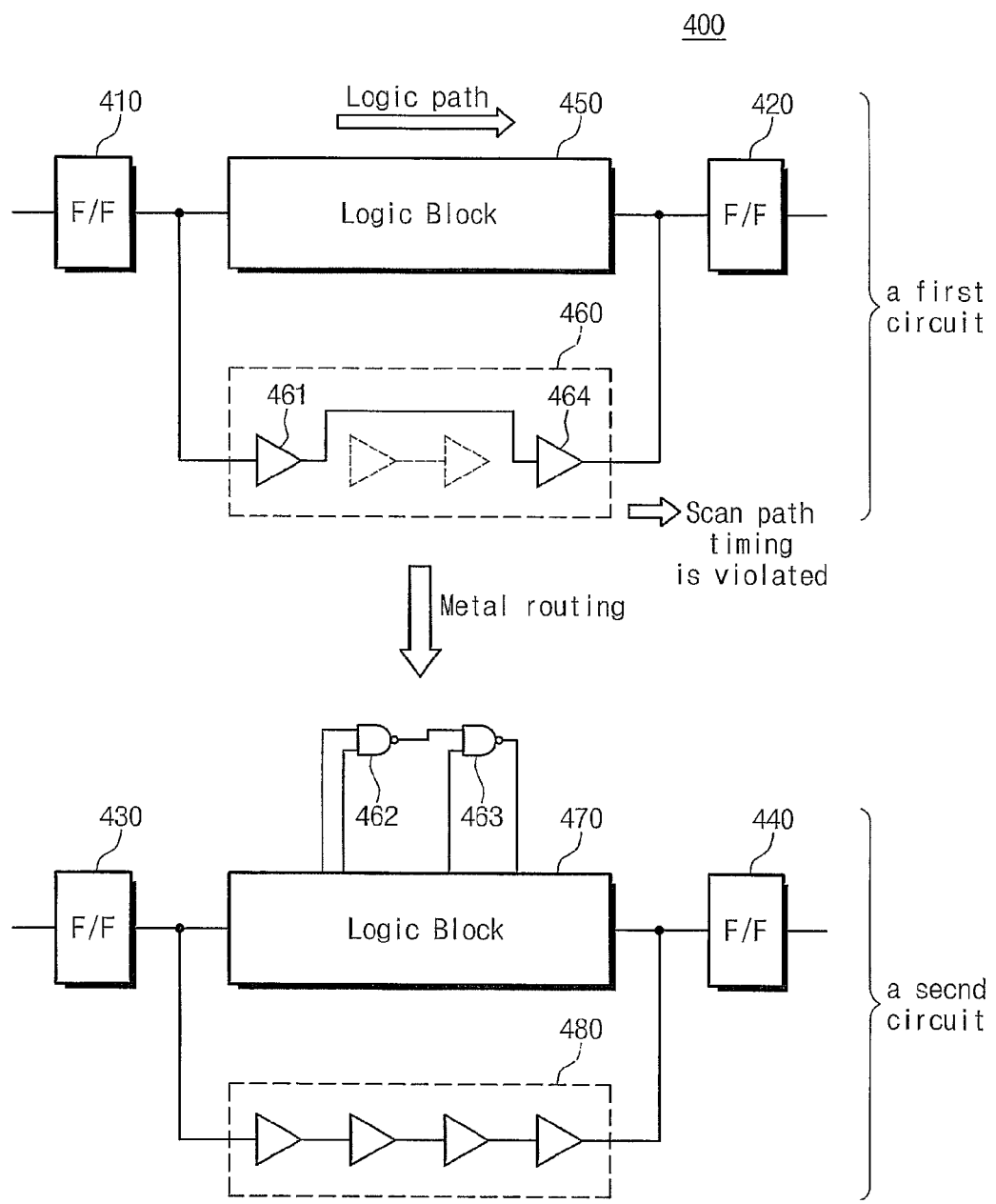
FIG. 3 is a diagram schematically illustrating an exemplary embodiment in accordance with principles of inventive concepts.

In exemplary embodiments in accordance with principles of inventive concepts a cell from a scan path block included in an integrated circuit may be employed to effect an ECO procedure as depicted in FIGS. 2 and 3.

FIG. 2 is a schematic diagram of an integrated circuit that includes a plurality of logic blocks and a scan path block. Integrated circuit 300 may include two circuits A and B. Circuit A may include a logic block 350, a scan path block 360, and two flip-flops 310 and 320. Circuit B may include a logic block 370, a scan path block 380, and two flip-flops 330 and 340.

In an exemplary embodiment in accordance with principles of inventive concepts, if logic block 370 of circuit B is in need of one or logic cells to replace defective cells or interconnections that may be detected during a production test, for example, a repair cell may be secured from scan path block 360 of the circuit A. Circuit defects that may be cured in this manner may be due to combinatorial or circuit timing violations, for example.

In an exemplary embodiment in accordance with principles of inventive concepts as depicted in the schematic diagram of FIG. 3 a logic cell may be re-assigned from a first circuit to operate in a second circuit in order to address a defect in the second circuit. An ECO integrated circuit 400 in accordance with principles of inventive concepts may include first and second circuits, or sub-circuits. The first circuit may include a logic block 450, a scan path block 460, and two flip-flops 410 and 420. The second circuit may include a logic block 470, a scan path block 480, and two flip-flops 430 and 440. In this exemplary embodiment in accordance with principles of inventive concepts, logic block 480 of the second circuit may employ two logic cells, such as NAND, NOR, INVERTER, or BUFFER cells, to address defects such as may be detected during integrated circuit testing, for example.

Buffer cells 462 and 463 included in the scan path block 460 of the first circuit may be used as repair, or ECO, cells for the logic block 470 of the second circuit. In accordance with principles of inventive concepts, buffer cells 462 and 463 may be separated from scan path block 460 and connected to logic block 470 of the second circuit by revising metal routing, for example, and may thereby repair defects in logic block 470. An exemplary embodiment in accordance with principles of inventive concepts of modifying cells, such as buffer cells 462 and 463, for use in a logic block, such as logic block 470, will be described in greater detail in the discussion related to FIGS. 4A through 9B.

Figure 10:
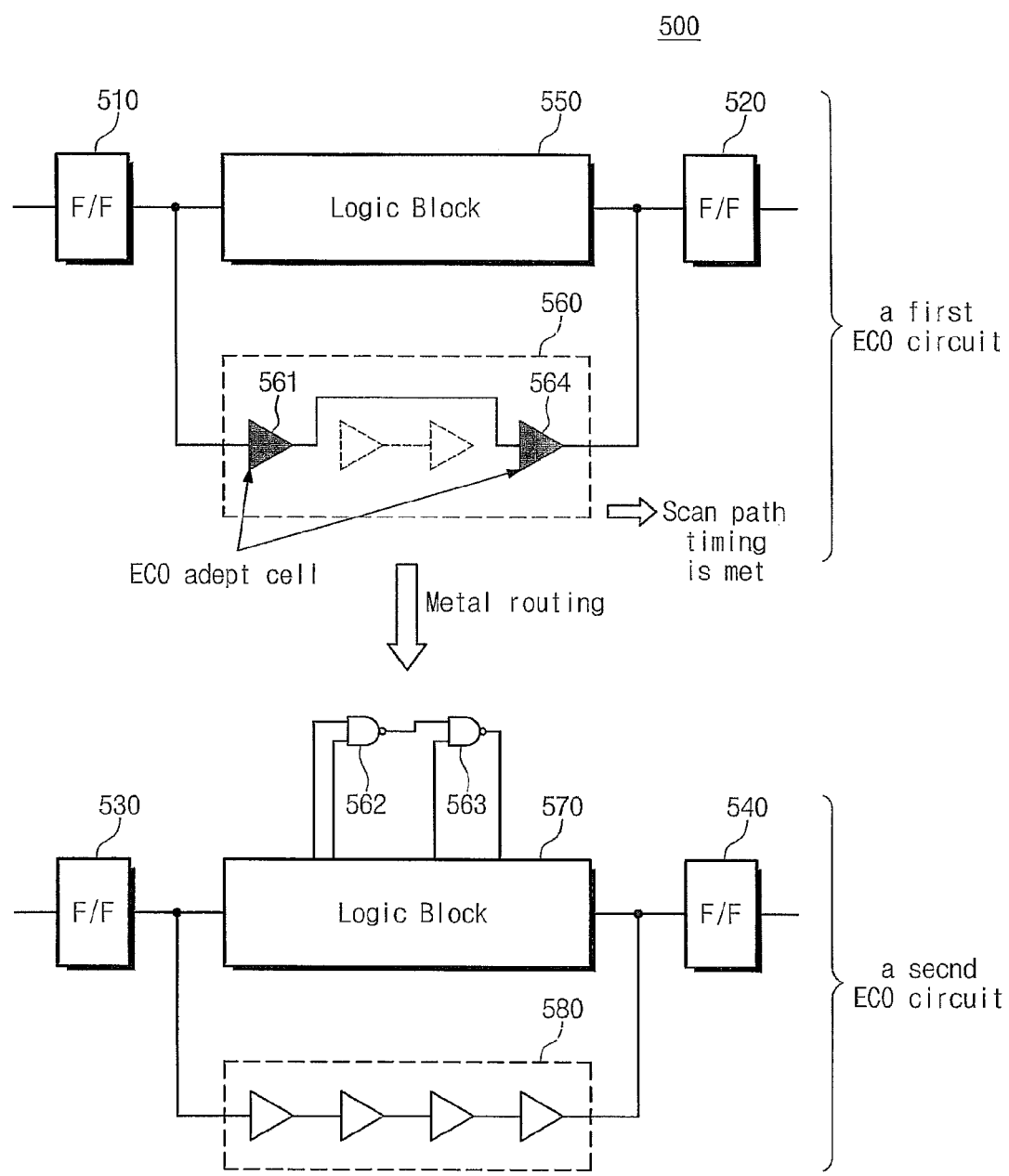
FIG. 10 is a diagram schematically illustrating an exemplary embodiment of a design changing method in accordance with principles of inventive concepts.
Figure 11:
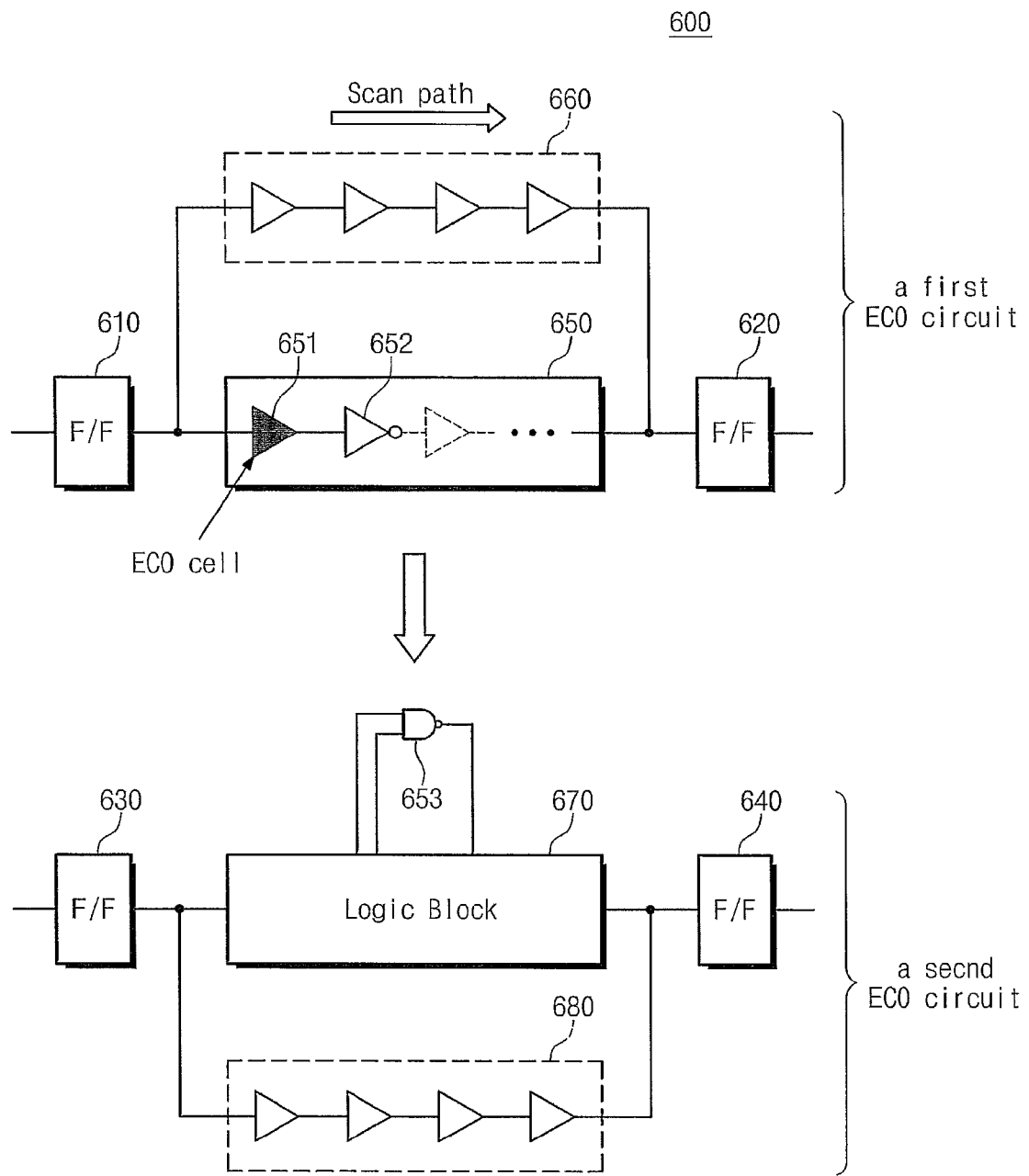
FIG. 11 is a diagram schematically illustrating an exemplary embodiment of a design changing method in accordance with principles of inventive concepts.

Because, in this exemplary embodiment in accordance with principles of inventive concepts, two buffer cells are removed from scan path block 460 of the first ECO circuit, the scan path timing of scan path block 460 may shortened and that shortening may be addressed as described in greater detail in the discussion related to FIGS. 10 and 11, for example.

Figure 4A:
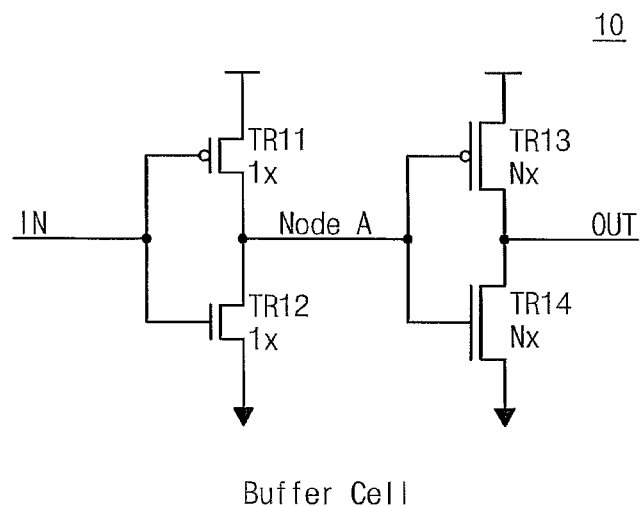
FIG. 4A is a circuit diagram illustrating a buffer cell.
Figure 4B:
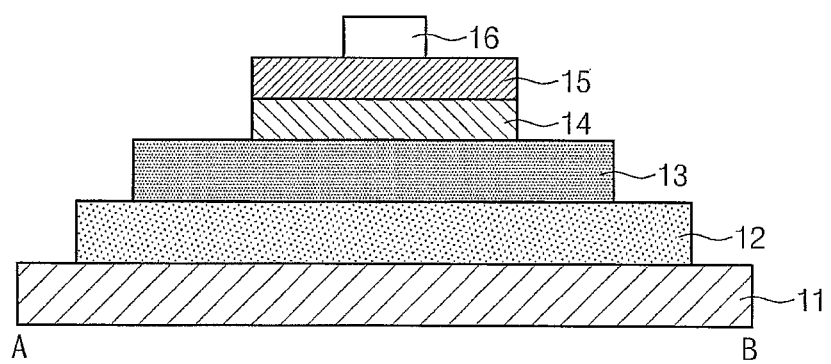
FIG. 4B is a cross-section view illustrating a semiconductor stack structure of a buffer cell.
Figure 4C:
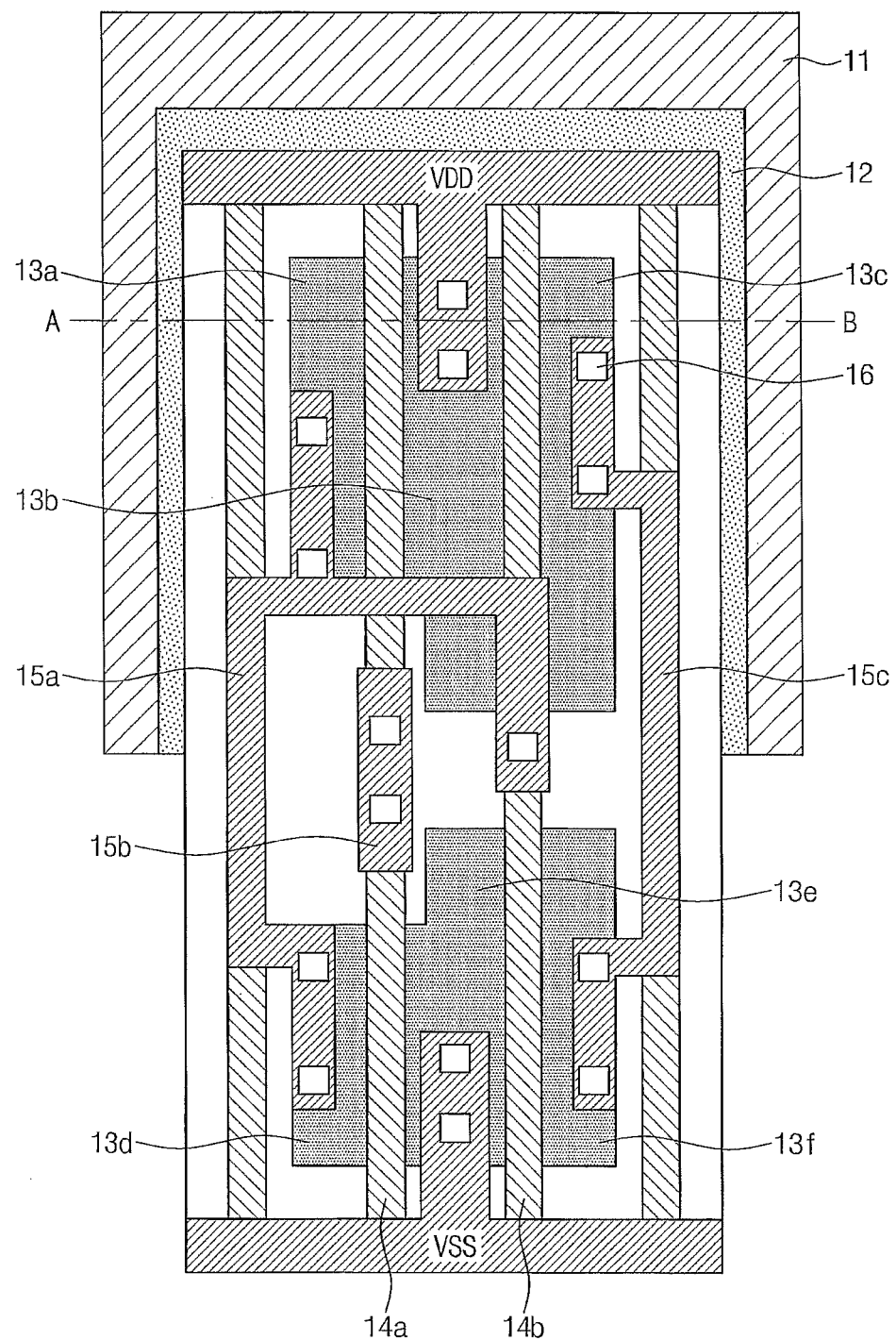
FIG. 4C is a top view schematically illustrating a layout of a buffer cell.

FIGS. 4A through 4C are diagram schematically illustrating a non-ECO, or unmodified, buffer cell.

FIG. 4A is a circuit diagram illustrating a non-ECO buffer cell. A non-ECO buffer cell 10 may include four transistors TR11, TR12, TR13, and TR14. In FIG. 4A, symbols '1×' or 'N×' may represent a relative channel width of each transistor. It may be assumed that the drive current for each transistor is proportional to channel width. When a high logic-level signal is applied to input IN, a PMOS transistor TR11 may be turned off and an NMOS transistor TR12 may be turned on. In this case, a low logic-level signal is applied to gates of transistors TR13 and TR14, so that PMOS transistor TR13 is turned on and NMOS transistor TR14 is turned off Thus, a high logic-level signal may be output from output OUT. When a low logic-level signal is applied to input IN, the transistors TR11, TR12, TR13, and TR14 may operate logically opposite, yielding a low logic-level signal at output OUT.

FIG. 4B is a cross-section view illustrating a semiconductor stack structure of a non-ECO buffer cell. Referring to FIG. 4B, a non-ECO buffer cell 10 may include an n-well layer 11, a blockage P-implantation (BP) layer 12, an active layer 13, a polysilicon layer 14, a metal layer 15, and a via 16, for example.

In non-ECO buffer cell 10, n-well layer 11 may be first stacked. BP layer 12 may be stacked on n-well layer 11. BP layer 12 may be used to prevent p-type impurities from being implanted in an n-type substrate. As will be described in greater detail below, a MOS transistor being formed on BP layer 12 may be a PMOS transistor.

Active layer 13 may be stacked on BP layer 12. Drain and source regions of the MOS transistor, and a channel region between source and drain regions, may be formed at active layer 13.

Polysilicon layer 14, which may include a gate layer of the MOS transistor, may be formed on active layer 13.

Metal layer 15 may be formed on polysilicon layer 14. Metal layer 15 may form the metal routing between polysilicon layer 14 and active layer 13, for example. Metal layer 15 may be used for the metal routing between polysilicon layer 14 and an input or output node, IN or OUT, of the integrated circuit.

Via 16 may be formed on the metal layer 15 and may connect metal layer 15 with another upper layer, for example.

FIG. 4C is a top view schematically illustrating a layout of a non-ECO buffer cell. A non-ECO buffer cell may include a n-well layer 11, a BP layer 12, active regions 13a through 13f, polysilicon layers 14a and 14b, metal routings 15a through 15c, a via 16.

BP layer 12 may be stacked on the n-well layer to prevent implantation of p-type impurities. Active layer 13 (refer to FIG. 4B) may include active regions 13a, 13b, and 13c formed on BP layer 12 and active regions 13d, 13e, and 13f formed in a region where BP layer 12 is not formed. Polysilicon layers 14a and 14b may be formed at the same interval. Polysilicon layers 14a and 14b formed on active layer 13 may include a gate layer of a transistor. Metal layer 15 (refer to FIG. 4B) may include metal routings 15a, 15b, and 15c.

In FIG. 4C, a drain region of a transistor TR11 (refer to FIG. 4A) may be formed in active region 13a, and source regions of transistors TR11 and TR13 may be formed in active region 13b. A drain region of transistor TR13 may be formed in active region 13c. A gate region of transistor TR11 may be formed in polysilicon layer 14a, between active regions 13a and 13b. A gate region of transistor TR13 may be formed in polysilicon layer 14b between active regions 13b and 13c. As described above, transistors TR11 and TR13 formed on BP layer 12 may be PMOS transistors.

A drain region of transistor TR12 (refer to FIG. 4A) may be formed in active region 13d, and source regions of transistors TR12 and TR14 may be formed in active region 13e. A source region of transistor TR14 may be formed in active region 13f. A gate region of transistor TR12 may be formed in polysilicon layer 14a between active regions 13d and 13e. A gate region of transistor TR14 may be formed in polysilicon layer 14b between active regions 13e and 13f. As described above, transistors TR12 and TR14 formed on the BP layer 12 may be NMOS transistors.

Metal routing 15a may form a node A (refer to FIG. 14A) and may electrically connect active regions 13a and 13d and polysilicon layer 14b. Metal routing 15b may form an input node IN (refer to FIG. 4A). Metal routing 15b may electrically connect input node IN and polysilicon layer 14a. Metal routing 15c may form an output node OUT (refer to FIG. 4A) and may electrically connect output node OUT and active regions 13c and 13f.

Via 16 may connect metal routing 15c and active region 13c, which are stacked vertically. Metal routings and an active region or a polysilicon layer may be connected by other vias.

With the above-described organization, PMOS transistors TR11 and TR13 may be formed in active regions 13a, 13b, and 13c on BP layer 12. NMOS transistors TR12 and TR14 may be formed in active regions 13d, 13e, and 13f. Polysilicon layers 14a and 14b may form gate layers of transistors. Transistors may be connected via metal routings 15a, 15b, and 15c to form a non-ECO buffer cell 10 illustrated in FIG. 4A.

Figure 5A:
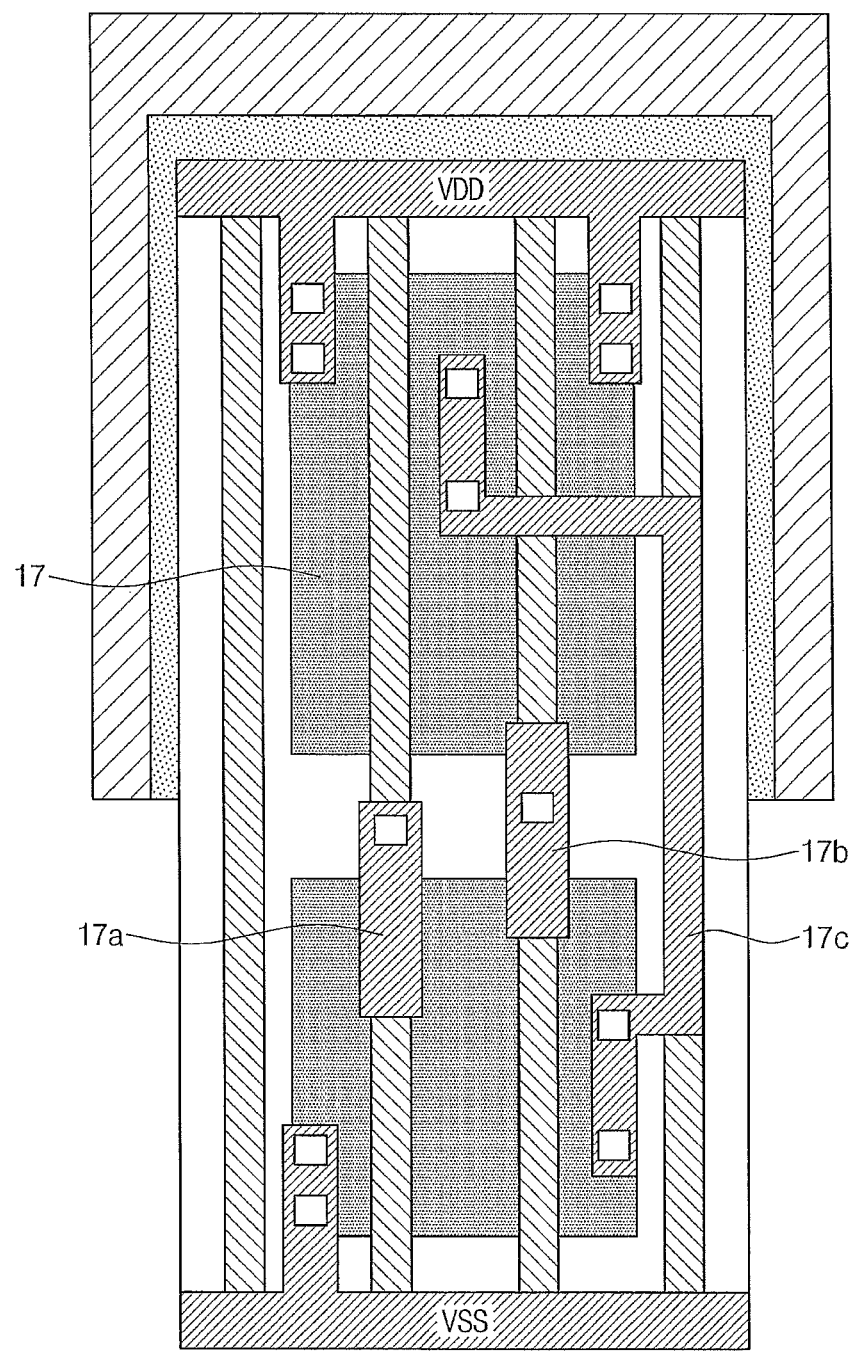
FIGS. 5A through 5C are top views schematically illustrating layouts of logic cells.
Figure 5B:
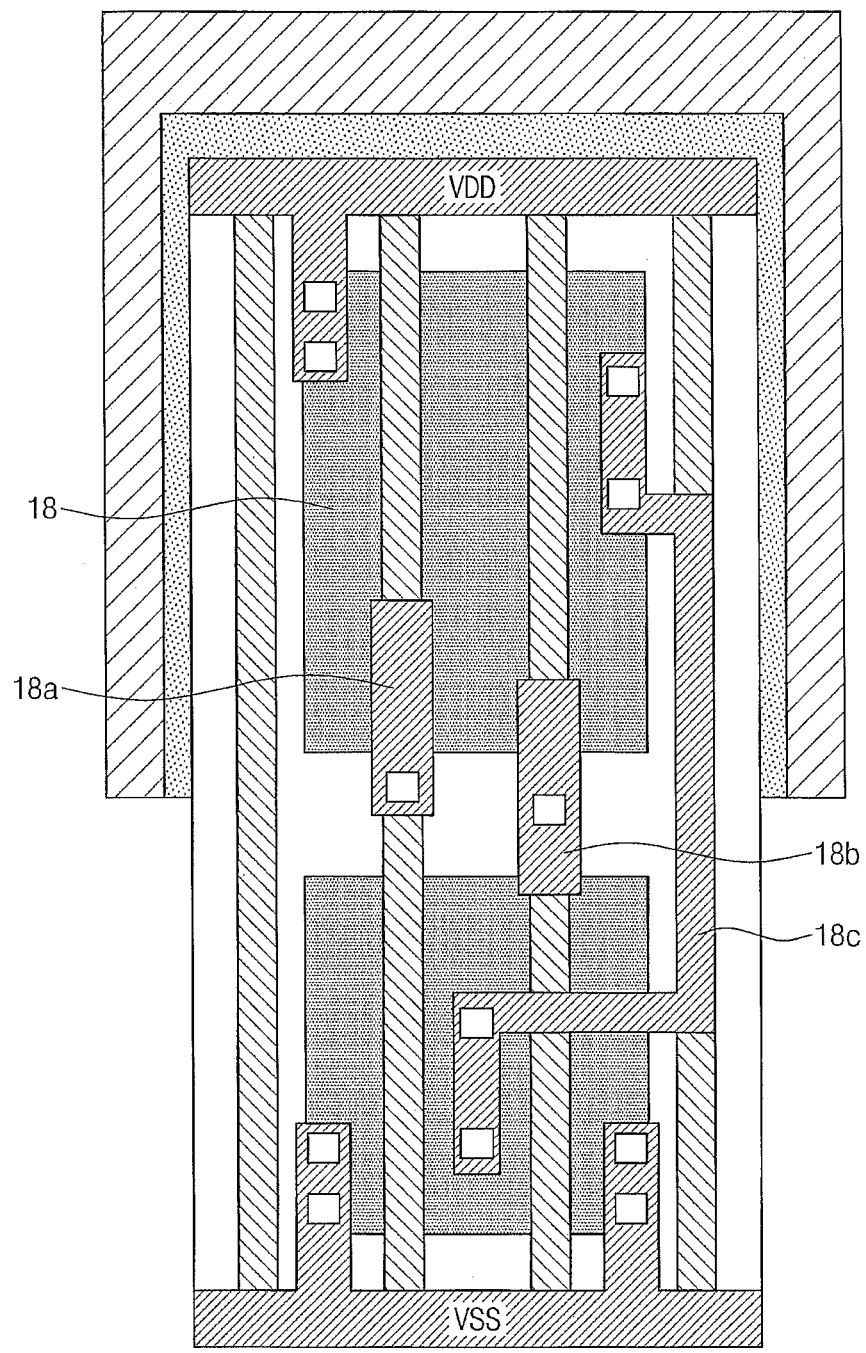
Figure 5C:
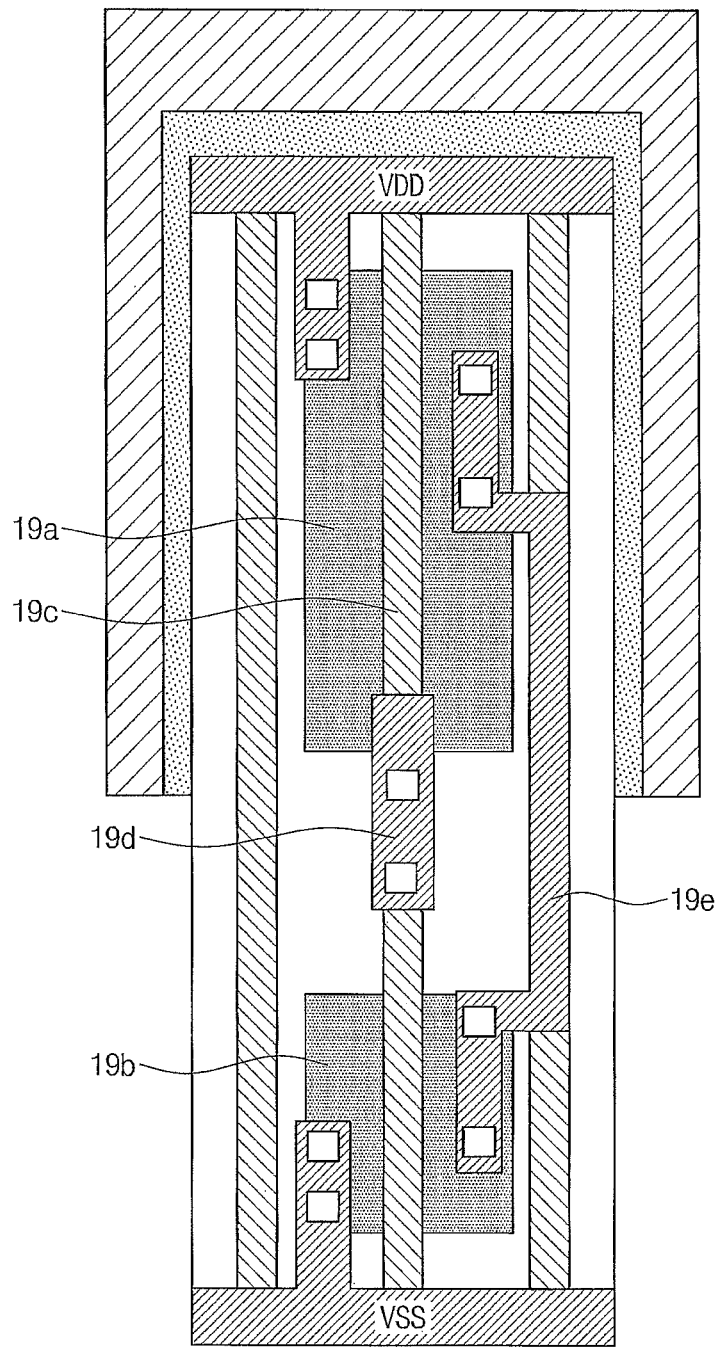

FIGS. 5A through 5C are top views schematically illustrating layouts of non-ECO logic cells. FIGS. 5A through 5C show a non-ECO NAND cell, a non-ECO NOR cell, and a non-ECO inverter cell, respectively.

Like a non-ECO buffer cell illustrated in FIG. 4B, each of the non-ECO NAND cell, the non-ECO NOR cell, and the non-ECO inverter cell may be formed by sequentially stacking an n-well layer, a BP layer, an active layer, a polysilicon layer, a metal layer, and a via, for example. An active area of each of the non-ECO NAND cell, the non-ECO NOR cell, and the non-ECO inverter may be different from that of a non-ECO buffer cell 10.

Referring to FIGS. 5A and 5B, an active area of each of the non-ECO NAND cell and the non-ECO NOR cell may be larger in size than that of non-ECO buffer cell 10. Referring to FIG. 4C, non-ECO buffer cell 10 may include transistors TR11 and TR12, which are connected to input node IN and may be implemented by a transistor with a relatively low drive current capacity and, therefore, transistors TR11 and TR12 may be formed on relatively narrow active regions 13a, 13b, 13c, and 13d. As illustrated in FIGS. 5A and 5B, active layer 13 may take the shape of an 'L' that is left-rotated by 180 degrees.

Non-ECO NAND and NOR cells may be implemented with little concern for the drive capacity of a transistor, unlike the non-ECO buffer cell 10. Thus, for ease of process, transistors may be formed over tetragonal active regions and active regions 17 and 18 of non-ECO NAND and NOR cells may be wider than an active region 13a of non-ECO buffer cell 10, for example.

Non-ECO NAND and NOR cells may have two input terminals (17a and 17b) and (18a and 18b) and one output terminal 17c/18c, respectively. Thus, the metal routing of non-ECO NAND and NOR cells may be different from that of non-ECO buffer cell 10 having one input terminal and one output terminal.

Referring to FIG. 5C, a non-ECO inverter cell may have active layers 19a and 19b smaller than that of non-ECO buffer cell 10. Like the non-ECO NAND and NOR cells, the active layers 19a and 19b may have a tetragonal shape. Alternatively, a non-ECO inverter cell may include a p-type transistor and an n-type transistor. Thus, one polysilicon layer 19c may be formed on an active region. The non-ECO inverter cell may have one input terminal 19d and one output terminal 19e.

As described above, active layers of non-ECO logic cells such as non-ECO NAND, NOR, and inverter cells may be different in shape from that of a non-ECO buffer cell. As will be described in greater detail below, because an active layer is formed in an initial step of a semiconductor process, it may be difficult to change its shape during a subsequent, ECO, step.

Figure 6A:
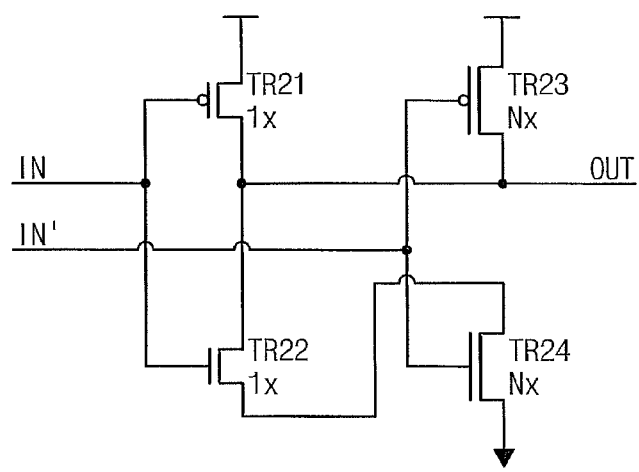
FIG. 6A is a circuit diagram schematically illustrating an exemplary embodiment of an ECO NAND cell in accordance with principles of inventive concepts.

FIG. 6A is a circuit diagram schematically illustrating an exemplary embodiment of an ECO NAND cell in accordance with principles of inventive concepts. Referring to FIG. 6A, ECO NAND cell 20 may include four transistors TR21, TR22, TR23, and TR24, similar to a non-ECO buffer cell 10 (refer to FIG. 4A). However, interconnection of the transistors via metal routing may be different from that of non-ECO buffer cell 10.

ECO NAND cell 20 may be implemented by changing the metal routing of a non-ECO buffer cell 10 illustrated in FIG. 4A. As illustrated in FIG. 6A, input terminal IN' may be additionally provided by revising the metal routing. An input terminal IN may be connected to gates of transistors TR21 and TR22 of a front stage, and input terminal IN' may be connected to gates of transistors TR23 and TR24 of a rear stage. A source of NMOS transistor TR22 may be connected to a drain of NMOS transistor TR24 without connection to ground. A drain of transistor TR24 may be disconnected from a drain of NMOS transistor TR23 and an output terminal OUT. A drain of NMOS transistor TR22 and a drain of PMOS transistor TR21 may be disconnected from gates of transistors TR23 and TR24, and may be connected to output terminal OUT.

With the above reconfiguration, if one of the two input terminals IN and IN' has a low logic-level signal, a high logic-level signal may be output from the output terminal OUT. When the two input terminals IN and IN' have a high logic-level signal, a low logic-level signal may be output from output terminal OUT. That is, ECO NAND cell 20, which may be reconfigured from a non-ECO buffer cell in accordance with principles of inventive concepts and illustrated in FIG. 6A, may perform a NAND operation.

Figure 6B:
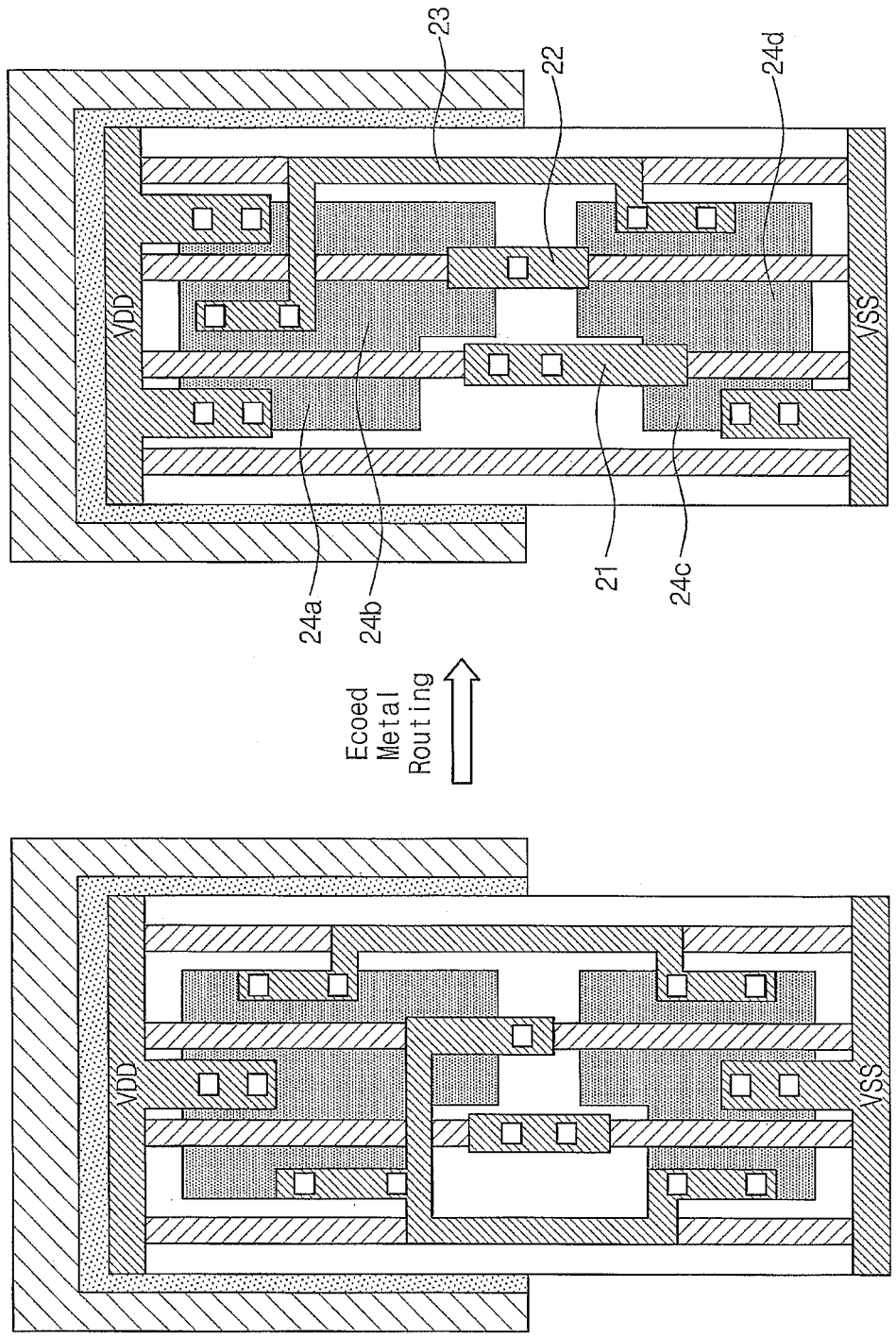
FIG. 6B is a diagram schematically illustrating a layout of an ECO NAND cell illustrated in FIG. 6A.

FIG. 6B is a diagram schematically illustrating a layout of ECO NAND cell schematically illustrated in FIG. 6A. Referring to FIG. 6B, an ECO NAND cell 20 may be implemented by changing the metal routing of a non-ECO buffer cell 10. Thus, an n-well layer, a BP layer, an active layer, and a polysilicon layer of the ECO NAND cell 20 may be substantially the same as those of the non-ECO buffer cell 10. The metal routings 21, 22, and 23 of the ECO NAND cell 20 may be different from those of the non-ECO buffer cell 10. Further, the metal routing connecting an active layer of the ECO NAND cell 20 with VDD and VSS may be different from that of the non-ECO buffer cell 10.

The ECO NAND cell 20 may be implemented by changing the metal routing of the non-ECO buffer cell 10 as illustrated in FIG. 6A. Like the non-ECO buffer cell 10, p-type transistors TR21 and TR23 may be formed on an active region which is formed over a BP layer. N-type transistors TR22 and TR24 may be formed on an active region which is formed outside the BP layer.

With revision of the metal routing, the ECO NAND cell 20 may have two input nodes 21 and 22 and one output node 23. The input nodes 21 and 22 may be connected to a gate region formed at a polysilicon layer. With the configuration illustrated in FIG. 6B, ECO NAND cell 20 may perform a NAND operation according to values input to input nodes 21 and 22 to output a resultant value to output node 23. Detailed configuration and operation of transistors may be substantially the same as that described in relation to FIG. 6A.

In accordance with principles of inventive concepts, the layout of ECO NAND cell 20 may be different from that of non-ECO NAND cell 17. Referring to FIGS. 5A and 6B, active region 24a of ECO NAND cell 20 may be smaller in size than active region 17 of the non-ECO NAND cell 17, because ECO NAND cell 20 has the same active region as non-ECO buffer cell 10, from which it may have been reconfigured.

Because the active area of a non-ECO buffer may be substantially the same as that of an ECO NAND cell but substantially different from the layout of a non-ECO NAND cell, the layout of a logic cell may be used to readily determine whether the logic cell is an ECO or non-ECO logic cell.

Figure 7A:
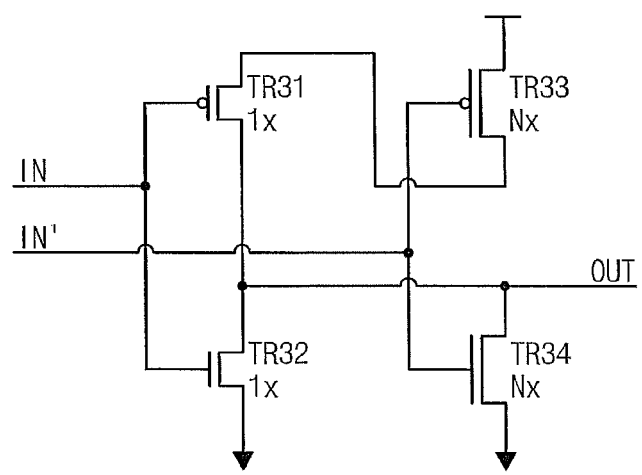
FIG. 7A is a circuit diagram schematically illustrating an exemplary embodiment of an ECO NOR cell in accordance with principles of inventive concepts.

FIG. 7A is a circuit diagram schematically illustrating exemplary embodiment of an ECO NOR cell in accordance with principles of inventive concepts. Referring to FIG. 7A, an ECO NOR cell 30 may include four transistors TR31, TR32, TR33, and TR34, similar to a non-ECO buffer cell 10 (refer to FIG. 4A).

ECO NOR cell 30 may be implemented by altering the metal routing of a non-ECO buffer cell 10 illustrated in FIG. 4A. For example, as illustrated in FIG. 7A, an input terminal IN' may be additionally provided by revising the metal routing. An input terminal IN may be connected to gates of transistors TR31 and TR32 of a front stage, and input terminal IN' may be connected to gates of transistors TR33 and TR34 of a rear stage. A source of transistor TR31 may be disconnected from a power terminal, and may be connected to a drain of PMOS transistor TR33. The drain of transistor TR33 may be disconnected from a drain of NMOS transistor TR34 and an output terminal OUT. A drain of NMOS transistor TR32 and a drain of PMOS transistor TR31 may be disconnected from gates of transistors TR33 and TR34, and may be connected to output terminal OUT.

With the above configuration, if one of two input terminals IN and IN' has a high logic-level signal, a low logic-level signal may be output from output terminal OUT. When the two input terminals IN and IN' have a low logic-level signal, a high logic-level signal may be output from output terminal OUT. That is, ECO NOR cell 30 illustrated in FIG. 7A may perform a NOR operation.

FIG. 7B is a diagram schematically illustrating an exemplary embodiment of a layout of an ECO NOR cell illustrated in FIG. 7A in accordance with principles of inventive concepts.

Referring to FIG. 7B, as with ECO NAND cell 20, ECO NOR cell 30 may be implemented by changing the metal routing of a non-ECO buffer cell 10. An n-well layer, a BP layer, an active layer, and a polysilicon layer of ECO NOR cell 30 may be substantially the same as those of non-ECO buffer cell 10. Metal routings 31, 32, and 33 of ECO NOR cell 30 may be different from those of non-ECO buffer cell 10. Additionally, the metal routing connecting an active layer of ECO NOR cell 30 with VDD and VSS may be different from that of non-ECO buffer cell 10.

ECO NOR cell 30 may be implemented by changing the metal routing of non-ECO buffer cell 10 as illustrated in FIG. 7A. Like non-ECO buffer cell 10, p-type transistors TR31 and TR33 may be formed on an active region that is formed over a BP layer. N-type transistors TR32 and TR34 may be formed on an active region that is formed outside the BP layer.

By revising the metal routing, ECO NOR cell 30 may have two input nodes 31 and 32 and one output node 33. Input nodes 31 and 32 may be connected to a gate region formed at a polysilicon layer. With the configuration illustrated in FIG. 7B, ECO NOR cell 30 may perform a NOR operation according to values input to input nodes 31 and 32 to output a resultant value to output node 33. Detailed configuration and operation of transistors may be substantially the same as that described in relation to FIG. 7A.

Like an ECO NAND cell 20, the exemplary embodiment of a layout of ECO NOR cell 30 in accordance with principles of inventive concepts may be different from that of a non-ECO NOR cell 18. Referring to FIGS. 5B and 7B, active region 34a of ECO NOR cell 30 may be smaller in size than active region 18 of non-ECO NOR cell 18, for example, because, in an exemplary embodiment, ECO NOR cell 30 has the same active region layout as non-ECO buffer cell 10.

Because the active area of a non-ECO buffer may be substantially the same as that of an ECO NOR cell but substantially different from the layout of a non-ECO NOR cell, the layout of a logic cell may be used to readily determine whether the logic cell is an ECO or non-ECO logic cell.

Figure 8A:
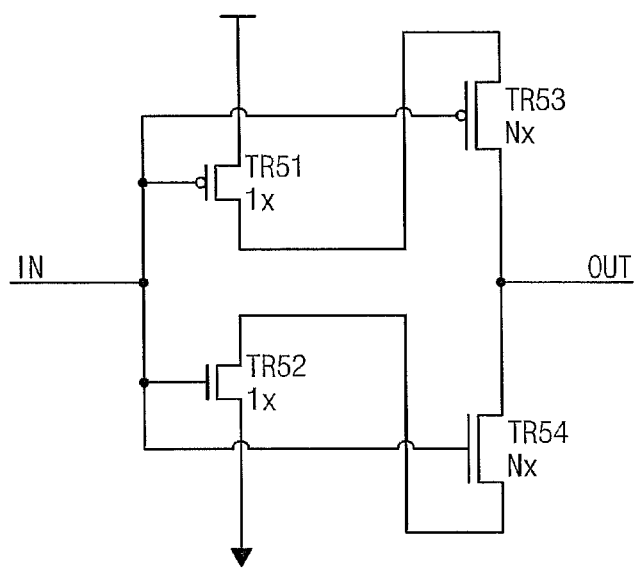
FIG. 8A is a circuit diagram schematically illustrating an exemplary embodiment of an ECO inverter cell in accordance with principles of inventive concepts.

FIG. 8A is a circuit diagram schematically illustrating an exemplary embodiment of an ECO inverter cell in accordance with principles of inventive concepts. An ECO inverter cell 50 may include four transistors TR51, TR52, TR53, and TR54, like a non-ECO buffer cell 10 (refer to FIG. 4A).

The ECO INVERTER cell 50 may be implemented, for example, by changing the metal routing of a non-ECO buffer cell 10, illustrated in FIG. 4A. As illustrated in FIG. 8A, input terminal IN may be connected to gates of transistors TR51 and TR52 of a front stage. A drain of PMOS transistor TR51 may be disconnected from transistor TR52, and may be connected to a source of PMOS transistor TR53. A drain of transistor TR52 may be disconnected from PMOS transistor TR51, and may be connected to a source of NMOS transistor TR54. A source of PMOS transistor TR53 may be disconnected from a power terminal, and a source of NMOS transistor TR54 may be disconnected from a ground. The output node OUT may be connected with the drain of transistor TR53 and the drain of transistor TR54.

With the above reconfiguration, if input terminal IN has a high logic-level signal, NMOS transistors TR52 and TR54 may be turned on, and PMOS transistors TR51 and TR53 may be turned off. Thus, a low logic-level signal may be output from output terminal OUT. When input terminal IN has a low logic-level signal, NMOS transistors TR52 and TR54 may be turned off, and PMOS transistors TR51 and TR53 may be turned on. Thus, a high logic-level signal may be output from output terminal OUT. That is, exemplary embodiment of an ECO inverter cell 30 in accordance with principles of inventive concepts illustrated in FIG. 8A may act as an inverter.

Figure 8B:
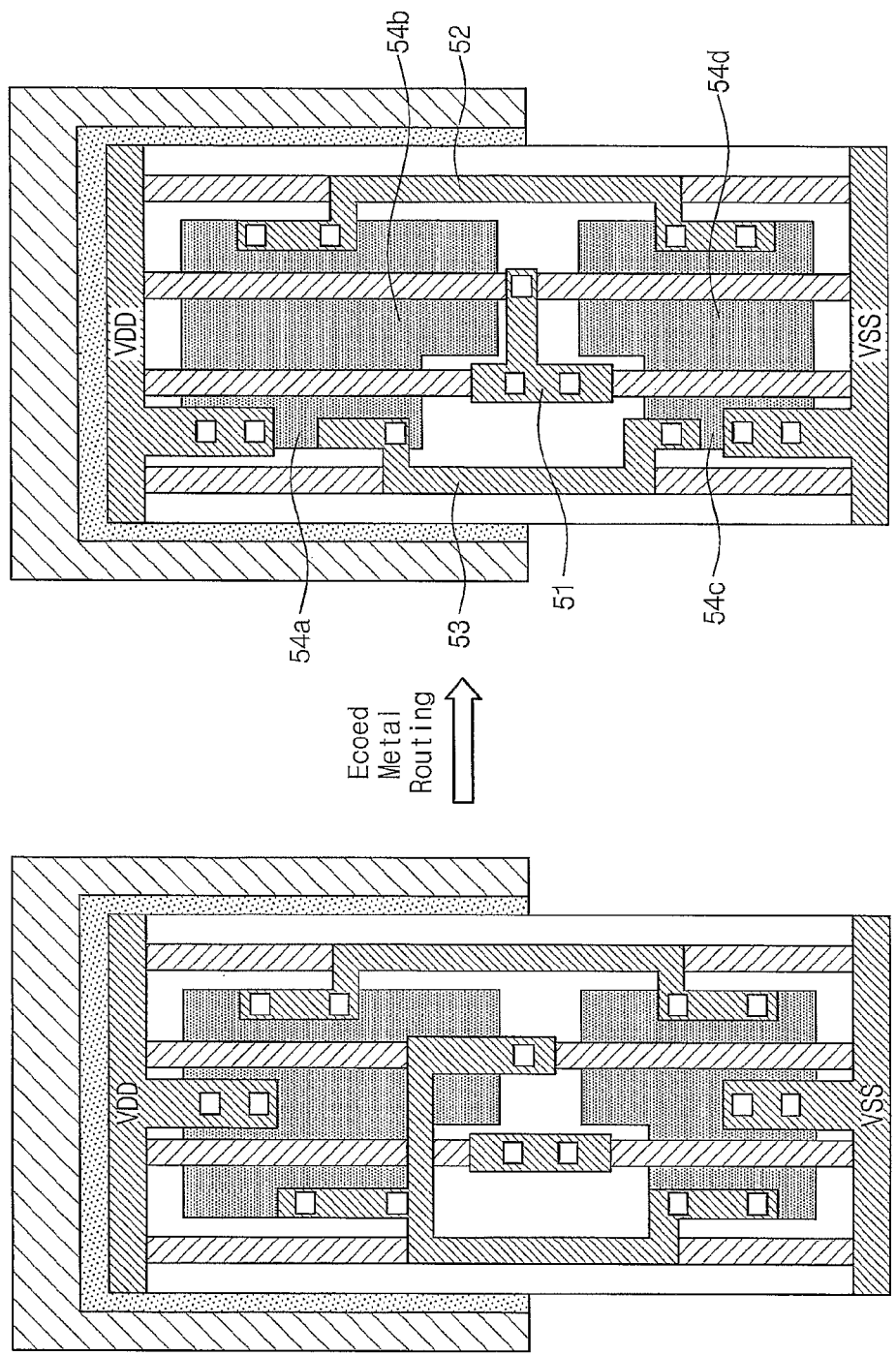
FIG. 8B is a diagram schematically illustrating a layout of an ECO inverter cell illustrated in FIG. 8A.

FIG. 8B is a diagram schematically illustrating exemplary layout of an ECO inverter cell in accordance with principles of inventive concepts illustrated in FIG. 8A. An ECO inverter cell 50 in accordance with principles of inventive concepts may be implemented by changing the metal routing of a non-ECO buffer cell 10. In such an embodiment, an n-well layer, a BP layer, an active layer, and a polysilicon layer of the ECO inverter cell 50 may be substantially the same as those of non-ECO buffer cell 10. However the metal routings 51, 52, and 53 of ECO inverter cell 50 may be different from those of non-ECO buffer cell 10.

ECO inverter cell 50 may be implemented by changing the metal routing of non-ECO buffer cell 10 as illustrated in FIG. 8A. Like non-ECO buffer cell 10, p-type transistors TR51 and TR53 may be formed on an active region which is formed over a BP layer. N-type transistors TR52 and TR54 may be formed on an active region which is formed outside the BP layer.

ECO inverter cell 50 may be configured to connect gates of transistors TR51 through TR54 via metal routing 51. Input node IN may be connected with the gates of transistors TR51 through TR54 formed on a polysilicon layer. Output node OUT may be connected to metal routing 52. With the configuration illustrated in FIG. 8B, ECO inverter cell 50 may perform an inverting operation. Detailed configuration and operation of transistors may be substantially the same as that described in relation to FIG. 8A.

Like an ECO NAND cell 20, an active layer of ECO inverter cell 50 may be different from that of a non-ECO inverter cell 19. Referring, for example, to FIGS. 5C and 8B, active regions 54a, 54b, 54c, and 54d of the ECO inverter cell 50 may be larger in size than active regions 19a and 19b of a non-ECO inverter cell 19 because the active regions of ECO inverter cell 50 are the same as non-ECO buffer cell 10.

A polysilicon layer 19c may be formed on an active region of non-ECO inverter cell 19. However, two polysilicon layers may be formed on an active region of the ECO inverter cell 50.

Because the active area of a non-ECO buffer may be substantially the same as that of an ECO inverter cell but substantially different from the layout of a non-ECO inverter cell, the layout of a logic cell may be used to readily determine whether the logic cell is an ECO or non-ECO logic cell. Additionally, a non-ECO inverter cell 19 may not employ an additional polysilicon layer, as an ECO cell 50 may. As a result, one may determine whether an inverter cell is a non-ECO or ECO inverter by examining the layout of the cell.

FIG. 9A is a circuit diagram schematically illustrating an exemplary embodiment of an ECO buffer cell in accordance with principles of inventive concepts. Referring to FIG. 9A, an ECO buffer cell 40 may be implemented by changing a metal layer of a non-ECO buffer cell 10 (refer to FIG. 4A).

ECO buffer cell 40 may include four transistors TR41, TR42, TR43, and TR44, that are formed substantially the same as those in a non-ECO buffer cell 10. However, the metal routing among the transistors TR41, TR42, TR43, and TR44 of the ECO buffer cell 40 may be different from the metal routing of a non-ECO buffer cell 10.

An exemplary embodiment in accordance with principles of inventive concepts of metal routing for changing non-ECO buffer cell 10 into an ECO buffer cell 40 will be described in greater detail. In ECO buffer cell 40, an input node IN may be disconnected from gates of transistors TR41 and TR42 of a front stage, and may be connected to gates of transistors TR43 and TR44 of a rear stage. Output node OUT may be disconnected from transistors TR43 and TR44, and may be connected between a drain of PMOS transistor TR41 and a drain of NMOS transistor TR42. The gates of transistors TR41 and TR42 may be connected to a connection node between a drain of PMOS transistor TR43 and a drain of NMOS transistor TR44.

With the above configuration, if a high logic-level signal is applied to input node IN, PMOS transistor TR43 may be turned off and NMOS transistor TR44 may be turned on. In this case, a low logic-level signal may be applied to the gates of transistors TR41 and TR42. As a result, transistor TR41 is turned on and transistor TR42 is turned off. Thus, a high logic-level signal may be transferred to output node OUT.

On the other hand, if a low logic-level signal is applied to input node IN, PMOS transistor TR43 may be turned on and NMOS transistor TR44 may be turned off. In this case, a high logic-level signal may be applied to the gates of transistors TR41 and TR42. As a result, transistor TR41 is turned off and transistor TR42 is turned on. Thus, a low logic-level signal may be transferred to output node OUT.

That is, since an output of the ECO buffer cell 40 may be substantially the same as an input thereof, ECO buffer cell 40 may act as a buffer.

In ECO buffer cell 40, channel widths of transistors TR41 and TR42 connected with output node OUT may be 1×. On the other hand, channel widths of transistors TR13 and TR14 connected with an output node of a non-ECO buffer cell 10 may be N×. As a result, the output drive capacity of ECO buffer cell 40 may be 1/N times of that of non-ECO buffer cell 10 and, as result, a cell delay time may increase. That is, the scan path time of a scan path block that employs ECO butter cell 40 may be greater than the scan path time of a scan path that employs non-ECO buffer cell 10.

Figure 9B:
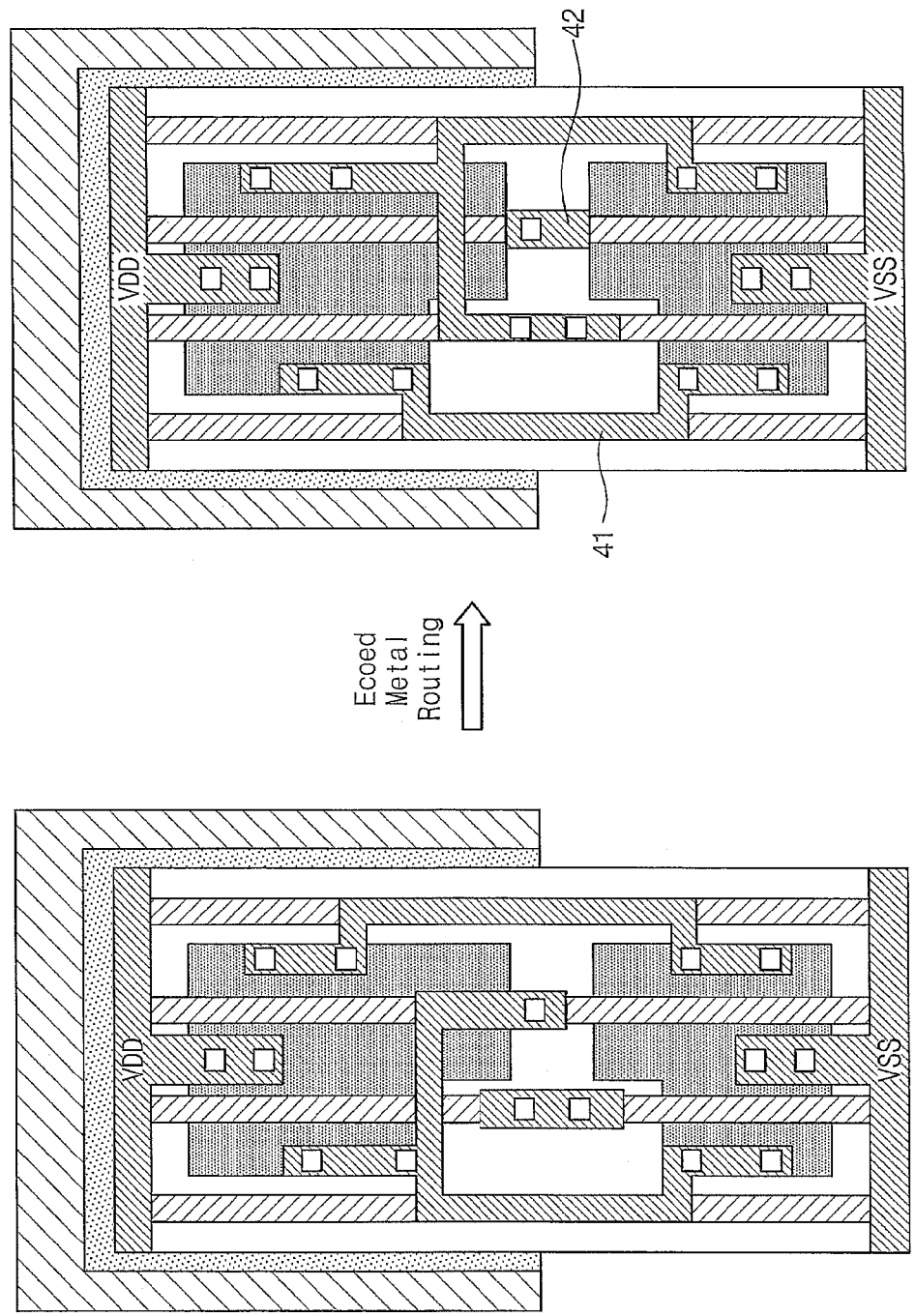
FIG. 9B is a diagram schematically illustrating a layout of an ECO buffer cell illustrated in FIG. 9A.

FIG. 9B is a diagram schematically illustrating an exemplary embodiment of a layout of an ECO buffer cell in accordance with principles of inventive concepts such as illustrated in FIG. 9A. As with an ECO NAND cell 20 and an ECO NOR cell 30, an ECO buffer cell 40 may be implemented by changing the metal routing of a non-ECO buffer cell 10. Thus, an n-well layer, a BP layer, an active layer, and a polysilicon layer of the ECO buffer cell 40 may be substantially the same as those of non-ECO buffer cell 10. However, the metal routings 41 and 42 of ECO buffer cell 40 may be different from those of non-ECO buffer cell 10.

ECO buffer cell 40 may be implemented by changing the metal routing of the non-ECO buffer cell 10 as illustrated in FIG. 9A. Like non-ECO buffer cell 10, p-type transistors TR41 and TR43 may be formed on an active region that is formed over a BP layer. N-type transistors TR42 and TR44 may be formed on an active region that is formed outside the BP layer.

The metal routing 41 of ECO buffer cell 40 may connect an output node OUT (refer to FIG. 9A) with a drain of transistor TR41 and a drain of transistor TR42. The metal routing 42 of ECO buffer cell 40 may connect an input node IN (refer to FIG. 9A) with gates of transistors TR43 and TR44. With the metal routing illustrated in FIG. 9B, ECO buffer cell 40 may buffer an input value to output it to output node OUT. Detailed configuration and operation of transistors may be substantially the same as that described in relation to FIG. 9A.

ECO buffer cell 40 may have substantially the same layout as non-ECO buffer cell 10, except for differences in metal routing. That is, in non-ECO buffer cell 10, input node IN may be connected to transistors TR11 and TR12 at a narrow active region (and, therefore, being of relatively low drive capacity). Output node OUT of non-ECO buffer cell 10 may be connected with transistors TR13 and TR14 at a wide active region (and, therefore, being of relatively high drive capacity). On the other hand, input node IN of ECO buffer cell 10 may be connected to transistors TR43 and TR44 at a wide active region (and, therefore, being of relatively high drive capacity) and output node OUT of ECO buffer cell 10 may be connected to transistors TR41 and TR42 at a narrow active region (and, therefore, being of relatively low drive capacity).

As described in the discussion related to FIGS. 1-9B, in exemplary embodiments in accordance with principles of inventive concepts the metallization of a logic cell, such as a buffer cell, for example, may be altered to yield a logic cell that may, after altering the metallization, be used to repair, replace, or otherwise address requirements for other logic cells in an integrated circuit. In exemplary embodiments in accordance with principles of inventive concepts, the metallization of a buffer cell may be altered to yield a NAND logic cell, a NOR logic cell, an INVERTER logic cell, or a buffer cell having different electrical characteristics than the original buffer cell, for example. In accordance with principles of inventive concepts, the metallization of logic cells other than buffer cells may be altered to yield different types of logic cells for use, for example, in ECO applications.

The block diagrams of FIGS. 10 and 11 will be used to describe a process in accordance with principles of inventive concepts for altering a circuit design using logic cells in accordance with principles of inventive concepts. Reference will be made to exemplary embodiments of such logic cells as were previously described in the discussion related to FIGS. 6A through 9B.

Referring to FIG. 10, an integrated circuit 500 in accordance with principles of inventive concepts may include first and second ECO circuits. The first ECO circuit may include a logic block 550, a scan path block 560, and two flip-flops 510 and 520. The second ECO circuit may include a logic block 570, a scan path block 580, and two flip-flops 530 and 540. In this exemplary embodiment, it is assumed that logic block 570 of the second ECO circuit may be repaired, or otherwise adjusted, in an ECO process using two NAND cells.

In accordance with principles of inventive concepts, buffer cells included in scan path block 560 of the first ECO circuit may be used as ECO cells for logic block 570 of the second ECO circuit. The buffer cells to be used as repair cells may be separated from the scan path block 560 of the first ECO circuit by revising the metal routing of integrated circuit 500, and may be connected to the logic block 570 of the second ECO circuit.

Additionally, the function of buffer cells may be converted into ECO NAND cells 562 and 563 (or other cells, such as NOR, or INVERTER cells) by revising the metal routing between transistors within each buffer cell, as described in the discussion of exemplary embodiments in accordance with principles of inventive concepts above. The buffer cells may be substantially the same as a buffer cell 10 described in the discussion related to FIGS. 4A through 4C. The ECO NAND cells 562 and 563 may be substantially the same as an ECO NAND cell described in relation to FIGS. 6A and 6B. In an exemplary embodiment in accordance with principles of inventive concepts, conversion of the buffer cells into the ECO NAND cells 562 and 563 may be achieved as described in the discussion related to FIGS. 6A and 6B.

Other buffer cells included in scan path block 560 may be converted into ECO buffer cells 561 and 564 to take the place of cells 562 and 563 and thereby obviate any disruption of scan path timing in scan path 560. Buffer cells may be converted to cells 561 and 564 by revising the metal routing between transistors included in each buffer cell. ECO buffer cells 561 and 564 may be substantially the same as an ECO buffer cell 40 and their conversion may be as described in the discussion related to FIGS. 9A and 9B, for example.

In exemplary embodiments in accordance with principles of inventive concepts, a logic cell such as an ECO NAND cell or an ECO buffer cell may be implemented by revising the routing within a buffer cell. Because the delay time of an ECO buffer cell may be longer than that of a non-ECO buffer cell, the delay time of a scan path may be unaltered even if a buffer cell is partially separated from a scan path block. By converting a logic cell that is operationally integrated in a circuit, such as a buffer cell in a scan path, an ECO change may be accomplished in accordance with principles of inventive concepts without requiring the use of a spare logic cell, such as previously-described spare cell 110, for example.

FIG. 11 is a diagram schematically illustrating a design changing method according to another exemplary embodiment in accordance with principles of inventive concepts. An integrated circuit in FIG. 11 may conduct ECO in a manner similar to that described in relation to FIG. 10 except that ECO cells for ECO are obtained from an adjacent logic block, rather than a scan path.

Referring to FIG. 11, an integrated circuit 600 may include first and second ECO circuits. The first ECO circuit may include a logic block 650, a scan path block 660, and two flip-flops 610 and 620. The second ECO circuit may include a logic block 670, a scan path block 680, and two flip-flops 630 and 640. It is assumed, for illustrative purposes, that logic block 670 of the second ECO circuit needs one NAND cell for ECO.

A buffer cell included in logic block 650 of the first ECO circuit may be used for an ECO cell of logic block 670 of the second ECO circuit. The buffer cell to be used as the ECO cell may be separated from scan path block 650 of the first ECO circuit by revising the metal routing, and may be connected to the logic block 670 of the second ECO circuit.

The buffer cell may be converted into an ECO NAND cell 653 by revising the metal routing between transistors within the buffer cell. Another buffer cell included in logic block 650 may be converted into an ECO buffer cell 651 to maintain correct pass timing in logic block 650 of the first ECO circuit.

Converting into ECO NAND and buffer cells may be made by revising the metal routing between transistors included within a converted cell. Conversion of cells may be achieved in accordance with principles of inventive concepts as described, for example, in the discussion related to FIG. 10.

In accordance with principles of inventive concepts, a an ECO design change may be accomplished without the use of a spare cell 110, because cells for ECO change may be obtained from a peripheral logic block or scan path, as well as from a spare cell 110. Because the delay time of an ECO buffer cell is longer than that of a non-ECO buffer cell, the delay time of a scan path may be maintained although a buffer cell is partially separated from a peripheral logic block.

Figure 12:
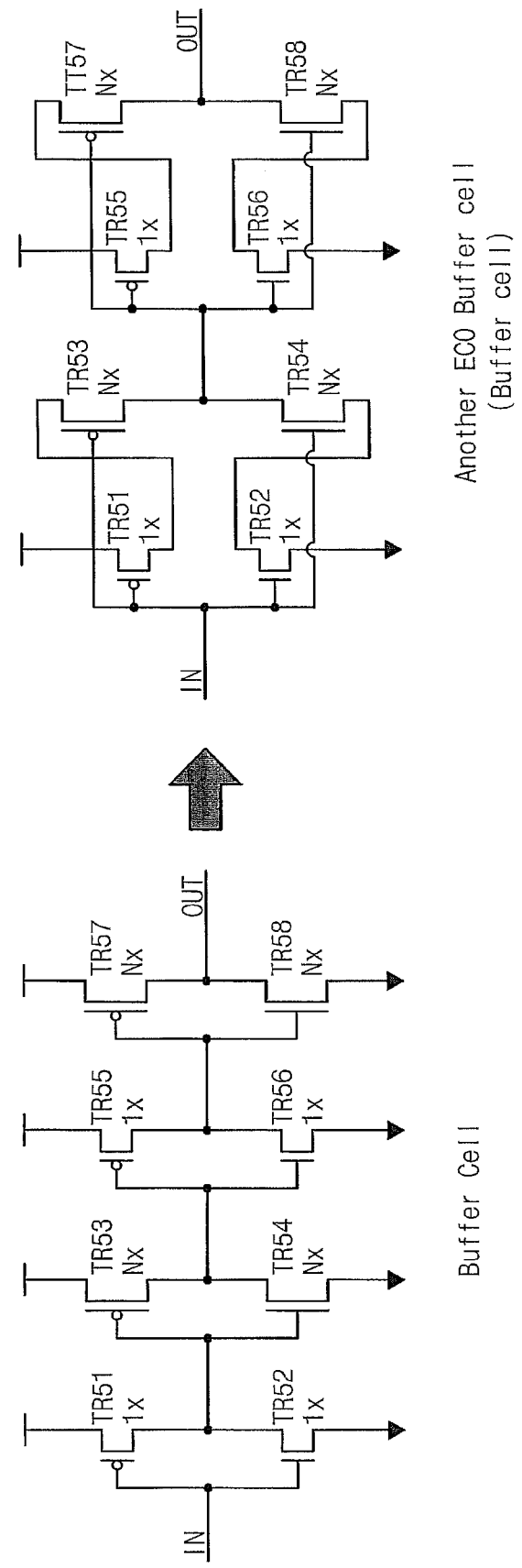
FIG. 12 is a diagram for describing an exemplary embodiment of a method of implementing an ECO buffer cell using an ECO inverter cell in accordance with principles of inventive concepts.

A method of using an INVERTER cell to produce an ECO buffer cell in accordance with principles of inventive concepts is depicted in FIG. 12. ECO buffer cell in FIG. 12 may include eight transistors TR51, TR52, TR53, TR54, TR55, TR56, TR57, and TR58. The ECO buffer cell in FIG. 12 may be implemented as a combination of two inverters. In this exemplary embodiment, transistors TR51, TR52, TR53, and TR54 may form a first inverter, and transistors TR55, TR56, TR57, and TR58 may form a second inverter.

As an ECO inverter cell, first and second inverters may be substantially the same as an ECO inverter cell 50 described in the discussion related to FIGS. 8A and 8B. Like the ECO inverter cell, the first and second inverters may be implemented by changing the metal routing within a non-ECO buffer cell 10, for example.

When a high logic-level signal is applied to an input node IN of the first inverter, transistors TR52 and TR54 may be turned on, so that a low logic-level signal is output from an output node of the first inverter. On the other hand, when a low logic-level signal is applied to the input node IN of the first inverter, transistors TR51 and TR53 may be turned on, so that a high logic-level signal is output from the output node of the first inverter. The output of the first inverter may be connected to an input of the second inverter. The second inverter may operate in the same manner as the first inverter. Accordingly, if a high logic-level signal is provided to the first inverter, the second inverter may output a high logic-level signal. On the other hand, if a low logic-level signal is provided to the first inverter, the second inverter may output a low logic-level signal. As a result, ECO buffer cell illustrated in FIG. 12 may act as a buffer cell.

In ECO buffer cell of FIG. 12, transistors TR53, TR54, TR57, and TR58 connected with an output of each inverter may have a channel width of Nx. However, transistors TR53, TR54, TR57, and TR58 may be connected with transistors TR51, TR52, TR55, and TR56 each having a channel width of 1x, respectively. Transistors TR53, TR54, TR57, and TR58 each having a channel width of Nx may not drive a current larger than that flowing through transistors TR51, TR52, TR55, and TR56 each having a channel width of 1x. That is, the total output drive capacity may be limited by a transistor having with the lowest drive capacity in a series of serially connected transistors. As a result, the output drive capacity of the ECO buffer cell in FIG. 12 may be reduced by 1/N, compared to the non-ECO buffer, and cell delay time may increase accordingly.

Figure 13A:
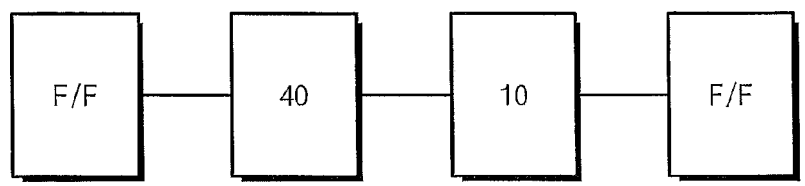
FIGS. 13A through 13C are block diagrams schematically illustrating the construction of an exemplary embodiment of a scan path block in accordance with principles of inventive concepts.
Figure 13B:
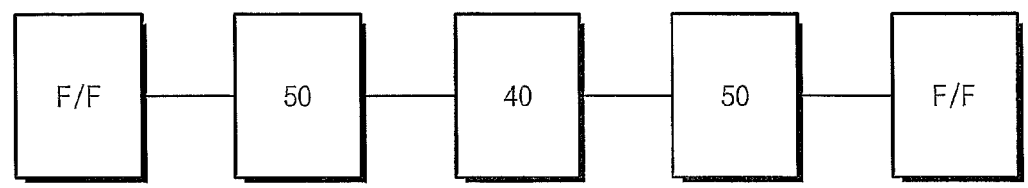
Figure 13C:
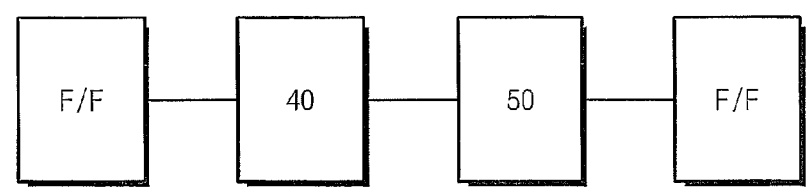

FIGS. 13A through 13C are block diagrams schematically illustrating the construction of a scan path block according to an exemplary embodiment in accordance with principles of inventive concepts.

Referring to FIG. 13A, a scan path block may include an ECO buffer cell 40 and a non-ECO buffer cell 10. An input terminal of the ECO buffer cell 40 and an output terminal of the non-ECO buffer cell 10 may be connected to different flip-flops F/F.

Referring to FIG. 13B, a scan path block may include two ECO inverter cells 50 and an ECO buffer cell 40. An input terminal of a front-stage ECO inverter cell 50 and an output terminal of a rear-stage ECO inverter cell 50 may be connected to different flip-flops F/F.

Referring to FIG. 13C, a scan path block may include an ECO buffer cell 40 and an ECO inverter cell 50. An input terminal of the ECO buffer cell 40 and an output terminal of the non-ECO buffer cell 10 may be connected to different flip-flops F/F.

The scan path blocks in FIGS. 13A and 13B may not invert input signals, while the scan path block in FIG. 13C may invert an input signal. The scan path blocks in FIGS. 13A and 13C may include the ECO buffer cell 40. Because the delay time of ECO buffer cell 40 is longer than that of non-ECO buffer cell 10, use of ECO buffer cell 40 may increase scan path times of scan path blocks. As a result, although a ECO cell is separated from a scan path block, it is possible to satisfy the scan path timing.

Although scan path blocks illustrated in FIGS. 13A through 13C include logic cells numbering three or less, additional logic cells may be included. For example, scan path blocks in FIG. 13A may include another logic cell between logic cells. That is, various logic cells or blocks can be disposed between an output of the ECO buffer cell 40 and an input of the non-ECO buffer cell 10, for example.

By revising the wiring of existing cells in accordance with principles of inventive concepts, a substantially complete integrated circuit may be modified without additional logic gates and without the great expense that would be required to implement a complete revision of the integrated circuit.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A logic cell within an integrated circuit comprising buffer cells and logic cells, comprising:
   a buffer cell input node configured to receive an input signal;
   a buffer cell output node configured to output a result of a logic operation on the input signal;
   a buffer cell active layer;
   a buffer cell polysilicon layer; and
   a reconfigured buffer cell metal layer connecting the buffer cell polysilicon layer to the buffer cell active layer, or to the buffer cell input node, or to the buffer cell output node, wherein a buffer cell from among the buffer cells is transformed into the logic cell other than another buffer cell from among the buffer cells by the reconfigured buffer cell metal layer.

2. The logic cell of claim 1, wherein the buffer cell active layer includes drain and source regions of a transistor.

3. The logic cell of claim 2, wherein the buffer cell polysilicon layer includes a gate region of the transistor.

4. The logic cell of claim 3, wherein the buffer cell active layer of the logic cell is narrower in area than an active layer of a non-reconfigured logic cell, from among the logic cells, within the integrated circuit.

5. The logic cell of claim 3, wherein the buffer cell active layer of the logic cell is wider in area than an active layer of a non-reconfigured inverter cell, from among the logic cells, within the integrated circuit.

6. The logic cell of claim 3, wherein the buffer cell input node is connected to a transistor having a relatively low drive capacity from among a plurality of transistors included in the logic cell.

7. The logic cell of claim 6, wherein the buffer cell output node is connected to a transistor having a relatively strong drive capacity from among the plurality of transistors included in the logic cell.

\* \* \* \* \*